(12) United States Patent
Collins et al.

(10) Patent No.: US 8,652,297 B2
(45) Date of Patent: Feb. 18, 2014

(54) SYMMETRIC VHF PLASMA POWER COUPLER WITH ACTIVE UNIFORMITY STEERING

(75) Inventors: Kenneth S. Collins, San Jose, CA (US);
Zhigang Chen, Campbell, CA (US);
Kartik Ramaswamy, San Jose, CA (US); James D. Carducci, Sunnyvale, CA (US); Shahid Rauf, Pleasanton, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 295 days.

(21) Appl. No.: 13/050,481

(22) Filed: Mar. 17, 2011

(65) Prior Publication Data

US 2012/0034136 A1   Feb. 9, 2012

Related U.S. Application Data

(60) Provisional application No. 61/370,188, filed on Aug. 3, 2010.

(51) Int. Cl.
| | |
|---|---|
| *C23C 16/00* | (2006.01) |
| *C23F 1/00* | (2006.01) |
| *H01L 21/306* | (2006.01) |
| *H01J 7/24* | (2006.01) |
| *H05B 31/26* | (2006.01) |

(52) U.S. Cl.
USPC ............ 156/345.44; 156/345.43; 156/345.47; 156/345.35; 315/111.21; 118/723 E; 118/723 ER

(58) Field of Classification Search
USPC ............ 118/723 E, 723 R, 723 ER, 723 AN; 156/345.43–345.47, 345.35, 345.36, 156/345.41; 315/111.21
See application file for complete search history.

(56) References Cited

U.S. PATENT DOCUMENTS

| | | | |
|---|---|---|---|
| 6,962,664 B2 * | 11/2005 | Mitrovic | ........................ 216/59 |
| 7,419,551 B2 | 9/2008 | Chandrachood et al. | |
| 7,732,728 B2 | 6/2010 | Dhindsa et al. | |
| 2003/0056901 A1 * | 3/2003 | Nakano et al. | ........... 156/345.47 |
| 2003/0079983 A1 * | 5/2003 | Long et al. | ................... 204/164 |
| 2004/0134616 A1 * | 7/2004 | Sago et al. | ............... 156/345.47 |
| 2005/0241769 A1 * | 11/2005 | Satoyoshi et al. | ........ 156/345.44 |
| 2010/0025384 A1 | 2/2010 | Todorow et al. | |
| 2010/0243609 A1 * | 9/2010 | Yamazawa et al. | ............. 216/71 |

FOREIGN PATENT DOCUMENTS

JP         05-013035 A       1/1993

* cited by examiner

*Primary Examiner* — Rakesh Dhingra
(74) *Attorney, Agent, or Firm* — Robert M. Wallace

(57) ABSTRACT

A coaxial VHF power coupler includes conductive element inside a hollow cylindrical outer conductor of the power coupler and surrounding an axial section of a hollow cylindrical inner conductor of the power coupler. Respective plural motor drives contacting the hollow cylindrical outer conductor are connected to respective locations of the movable conductive element.

14 Claims, 10 Drawing Sheets

SYMMETRIC VHF PLASMA POWER COUPLER WITH ACTIVE UNIFORMITY STEERING

CROSS-REFERENCE TO RELATED APPLICATIONS

This application claims the benefit of U.S. Provisional Application Ser. No. 61/370,188, filed Aug. 3, 2010 entitled SYMMETRIC VHF PLASMA POWER COUPLER WITH ACTIVE UNIFORMITY STEERING, by Kenneth S. Collins, et al.

BACKGROUND

The disclosure concerns a plasma reactor used in fabrication of microelectronic semiconductor circuits. Such a reactor includes a vacuum chamber for processing a workpiece, such as a semiconductor wafer, an RF power applicator and process gas injection apparatus. Control of plasma ion density distribution within the chamber is essential in order to ensure uniformity of processing, or a uniform distribution of etch (or deposition) rate across the surface of the workpiece. The vacuum chamber is typically configured as a cylinder so as to optimize uniformity of plasma ion distribution in a radial direction and about an azimuthal direction. As employed herein, the term azimuthal direction refers to a rotational direction around the axis of symmetry of the cylindrical chamber.

One problem is that the vacuum chamber itself includes non-symmetrical features that interrupt the cylindrical symmetry of the chamber and therefore create non-uniformities in plasma ion distribution. This may be due, for example, to the effect such asymmetrical features have on the electromagnetic environment of the plasma or on the gas flow distribution within the chamber, or both. Such non-symmetrical features may include a vacuum port in the floor of the chamber and a workpiece (wafer) slit port ("slit valve") through which the wafer is inserted into and removed from the chamber. These features tend to produce non-uniformities in plasma ion distribution in the azimuthal direction, or azimuthal non-uniformities.

That is needed is a way of reducing or eliminating such azimuthal non-uniformities in plasma ion distribution.

SUMMARY

A plasma reactor includes a vacuum chamber enclosed by a cylindrical side wall, a floor and an overhead ceiling, the overhead ceiling including a ceiling electrode electrically insulated from the side wall. The reactor further includes a coaxial power coupler including: (a) a hollow cylindrical outer conductor having a bottom end coupled to the side wall and a top end, (b) a hollow cylindrical inner conductor coaxial with the outer conductor and having a bottom end coupled to the ceiling electrode and a top end, (c) a conductor electrically contacting the top ends of the inner and outer conductors, and (d) an elongate tap conductor electrically separate from and extending radially through the outer conductor and having a first end connected to the inner conductor and a second end for coupling to an RF power generator. The reactor further includes a movable conductive element inside the hollow cylindrical outer conductor and surrounding an axial section of the hollow cylindrical inner conductor, and respective plural motor drives contacting the hollow cylindrical outer conductor and connected to respective locations of the movable conductive element, the movable conductive element being electrically coupled to the outer conductor through the motor drives.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
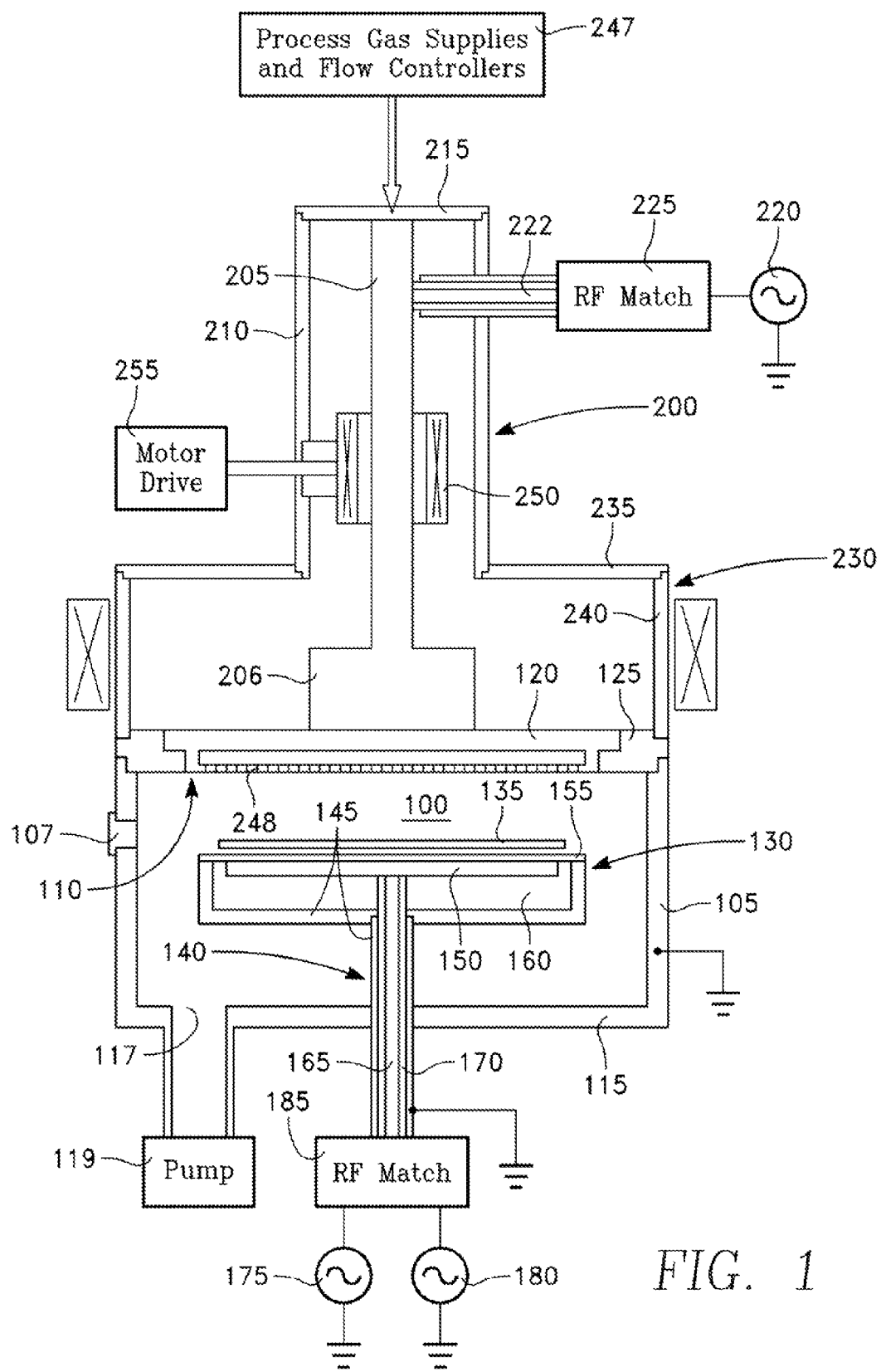
FIGS. 1, 2A and 2B depict a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring now to FIG. 1, a plasma reactor includes a vacuum chamber 100 enclosed by a cylindrical side wall 105, a ceiling 110 and a floor 115. The side wall 105 and floor 115 may be formed of metal and electrically grounded. The floor 115 has an opening or pumping port 117 through which a vacuum pump 119 is coupled to the interior of the chamber 100. The ceiling 110 includes an RF-hot gas distribution plate or showerhead 120 that functions as both a gas distributor and as a ceiling electrode. The showerhead 120 is formed of a conductive material and is supported at its periphery by an insulating annular ring 125 engaged with the side wall 105. The showerhead 120 receives plasma VHF source power and receives process gases in a manner to be described below. A workpiece support pedestal 130 is centered within the chamber 100 to support a workpiece 135, such as a semiconductor wafer, in facing relationship with the showerhead 120. The cylindrical side wall 105 has a slit valve opening 107 that extends around only a portion of the circumference of the side wall 105. The slit valve opening 107 provides ingress and egress to and from the chamber 100 for the workpiece 135. The pedestal 130 includes a center post 140 that extends through the floor 115. An electrically grounded outer layer 145 may enclose the pedestal 130 including the post 140. An insulated cathode electrode 150 is covered by a top insulating layer 155 and an underlying insulating bed 160. RF bias power is supplied to the cathode electrode 150 through a center conductor 165. The center conductor 165 may be separated from the grounded outer layer 145 by a coaxial insulating layer 170. The bottom end of the center conductor 165 may be coupled to respective RF bias power generators 175, 180 through an RF impedance match circuit 185.

A transmission line coaxial structure 200, which may be configured as a shorted coaxial tuning stub, has an RF-hot center conductor 205 and a grounded outer conductor 210. The center and outer conductors 205, 210 may be hollow, although the center conductor 205 may be solid in one embodiment. The bottom end of the center conductor 205 is connected to the showerhead 120. A shorting device 215 connects the top end of the center conductor 205 to the top end of the outer conductor 210. While in the illustrated embodiment the shorting device may be a conductor touching the top ends of the center and outer conductors 205, 210, it may be spaced from the top ends by a suitable distance, and may not necessarily be a conductor. In such embodiments, the shorting device 215 may provide capacitive coupling rather than a direct electrical connection. A VHF generator 220 supplying plasma source power is coupled to the center conductor 205 by a radially extending elongate tap conductor 222 at a selected axial location along the length of the center conductor 205. This axial location may be selected in accordance with published techniques so that an impedance match is obtained at the frequency of the VHF generator 220. In addition, a separate RF match circuit 225 may be connected between the VHF generator 220 and the tap conductor 222.

The outer conductor 210 has a diameter less than that of the chamber side wall 105. A conductive expansion section 230, including a radially extending skirt 235 and an end piece 240, connects the bottom end of the outer conductor 210 to the grounded chamber side wall 105.

The center conductor 205 may be a hollow cylinder so as to provide a space for utility conduits to the showerhead 120 (e.g., for gas lines, coolant lines and sensors). For example, gas lines may extend through the center conductor 205 from a process gas supply and manifold 247 (which may include flow controllers) to internal gas flow passages (not shown) within the showerhead 120 terminating in gas injection orifices 248 in the bottom surface of the showerhead 120. In order to accommodate connection of such utility lines in a radial zone of the showerhead 120 greater than the diameter of the center conductor 205, a conductive expansion section 206 is coupled between the bottom end of the center conductor 205 and the showerhead 120.

In alternative embodiments, process gas is not injected through the showerhead 120 but rather by other means, in which case the showerhead 120 need contain no gas injection orifices, and functions only as a ceiling electrode.

As discussed previously herein, non-symmetrical features of the chamber 100, such as the slit valve opening 107 or the pumping port 117, may induce azimuthal non-uniformities in plasma ion distribution. Reduction or elimination of such non-uniformities is provided by an active uniformity steering element.

Figure 2A:
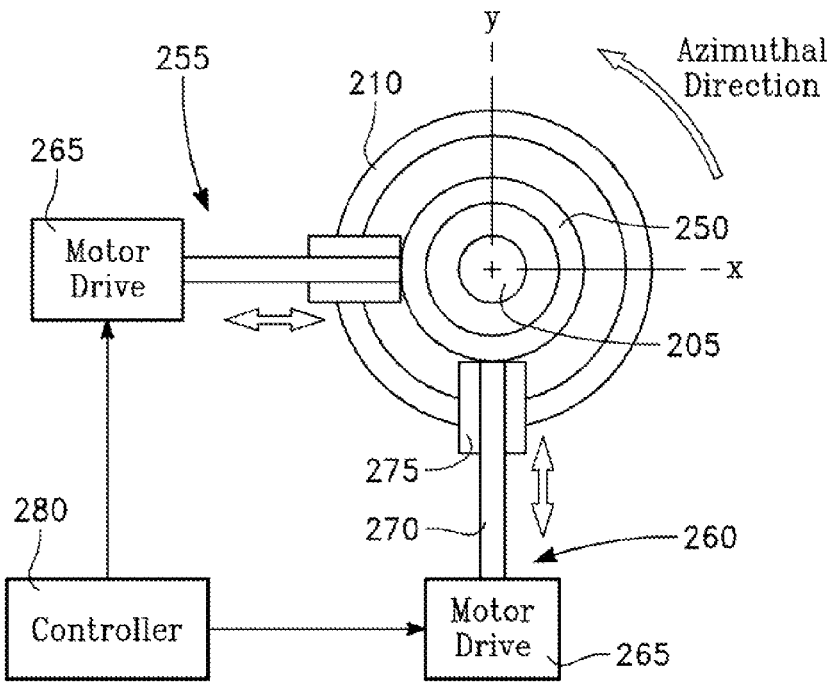

In a first embodiment, an active uniformity steering element includes a conductive (or at least semiconductive) ring 250 surrounding a section of the center conductor 205. Referring to FIG. 2A, a pair of motor drives 255, 260 supported on the outer conductor 210 hold the conductive ring 250 and control its radial location relative to the center conductor 205. In accordance with one embodiment, the motor drives 255, 260 control the non-concentricity of the ring 250 relative to the axis of symmetry of the center conductor 205. FIG. 2A depicts an instance in which the ring 250 is concentric relative to the center conductor 205, for minimal or no effect on plasma ion distribution.

Figure 2B:
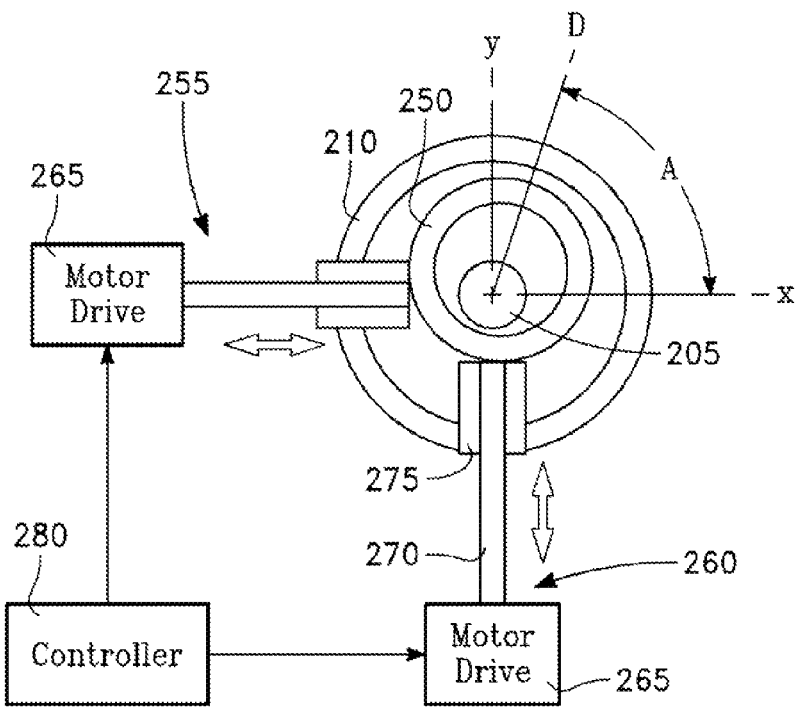

A change in plasma ion distribution is effected by shifting the ring 250 to a non-concentric position relative to the center conductor 205, as depicted in FIG. 2B. As indicated in FIG. 2B, with reference to a stationary X axis, the azimuthal angle A of the direction D of non-concentricity is selected in accordance with the desired change or correction in plasma ion density distribution. This may be selected to compensate for azimuthal (asymmetrical) non-uniformity in plasma ion distribution or etch rate distribution on a workpiece. As discussed above, such asymmetries in plasma ion distribution may be attributable to asymmetrical features of the chamber, such as the slit valve opening 107 or the pumping port 117. As indicated in FIG. 2A, the motor drive 255 controls the location of the ring 250 in a radial direction along an X-axis, while the motor drive 260 controls the location of the ring 250 in a radial direction along a Y-axis. The ring 250 is electrically connected to the grounded outer conductor through the motor drives 255, 260. Its proximity to the RF-hot center conductor 205 affects capacitive coupling to the center conductor 210. Varying the location of the ring 250 along the X-axis and Y-axis (FIGS. 2A and 2B) varies the azimuthal distribution of capacitive coupling within the transmission line structure 200, and therefore controls the azimuthal distribution of RF power on the showerhead 120. By controlling the two motor drives 255, 260, a particular azimuthal asymmetry in RF power distribution on the showerhead 120 may be selected that precisely compensates for azimuthal asymmetry in observed process rate distribution (or plasma ion distribution). Such compensation provides a more uniform distribution of process rate across the workpiece 135. (Alternatively, the location of the ring 250 may be controlled to achieve a particular desired non-uniformity in process rate distribution that produces a desired effect on the workpiece.)

The motor drives 255 and 260 may be identical in structure, each including an electric motor 265 of a conventional type, an axially movable shaft 270 driven by the electric motor 265 having an outer end connected to the ring 250, and a guide 275 fixed to the outer conductor 210 having an opening through which the axially movable shaft 270 extends. As illustrated in FIG. 1, the ring 250 may be configured to have a thin dimension in the radial direction and to have a broad surface in the axial direction of an axial length exceeding the radial dimension (or thickness). However, the cross-section shape of the ring 250 may be other than that depicted in the drawings. The shaft 270 and guide 275 may be conductive to ensure that the ring 250 is electrically grounded. A uniformity distribution controller 280 controls the motor drives 255, 260 in accordance with a desired azimuthal distribution of RF power on the showerhead or ceiling electrode 120.

Figure 3:
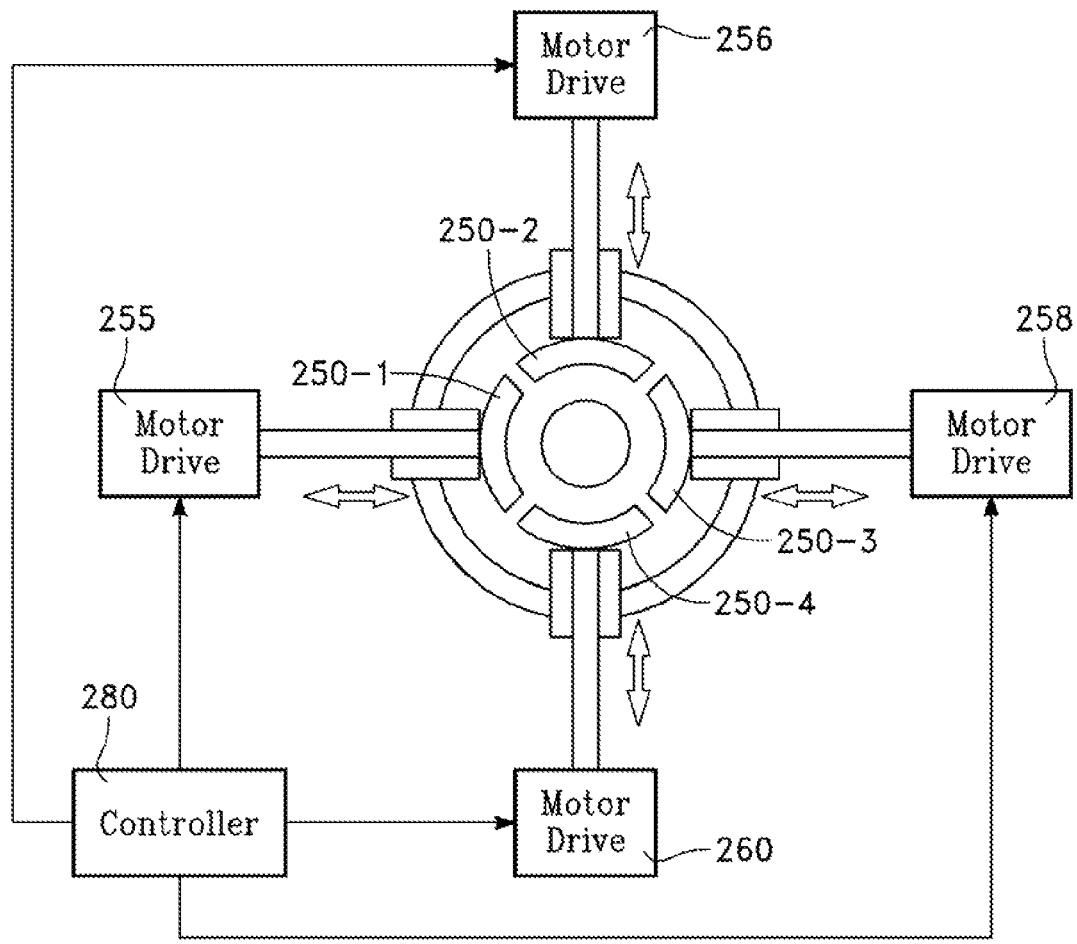
FIG. 3 depicts a second embodiment.

FIG. 3 depicts a modification of the embodiment of FIG. 2A, in which the ring 250 is divided into 3 or more separate arc sections that are independently controlled by separate drive motors. In the illustrated embodiment, the ring 250 is quartered into four arc sections 250-1, 250-2, 250-3, 250-4, so that each arc section sub-tends an angle of 90 degrees. The four arc sections 250-1, 250-2, 250-3, and 250-4 are driven by four motor drives 255, 256, 258, 260, respectively. The ring 250 may be divided into any suitable number of arc sections, and controlled with a corresponding number of motor drives.

Figure 4:
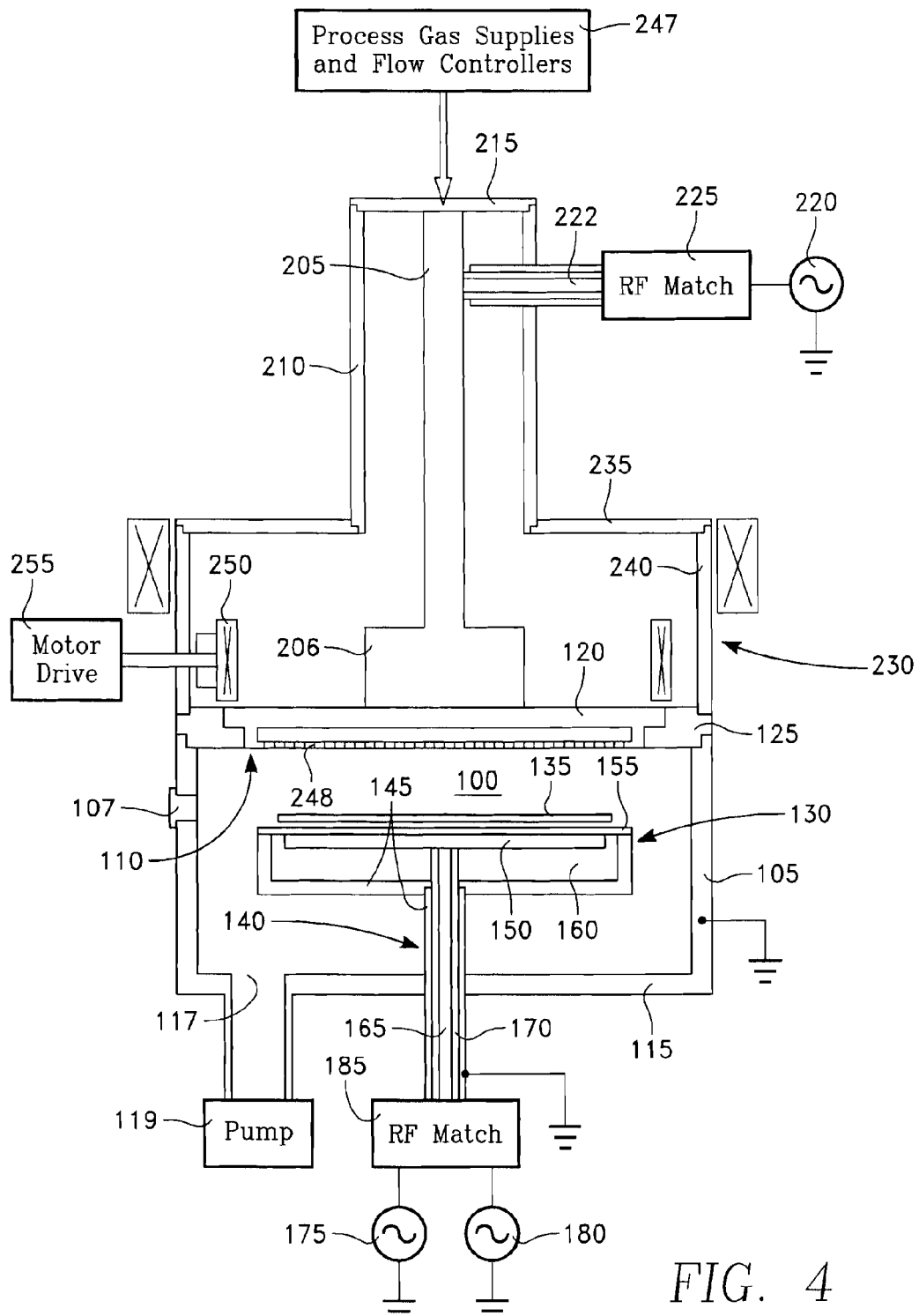
FIGS. 4 and 5 depict a third embodiment.
Figure 5:
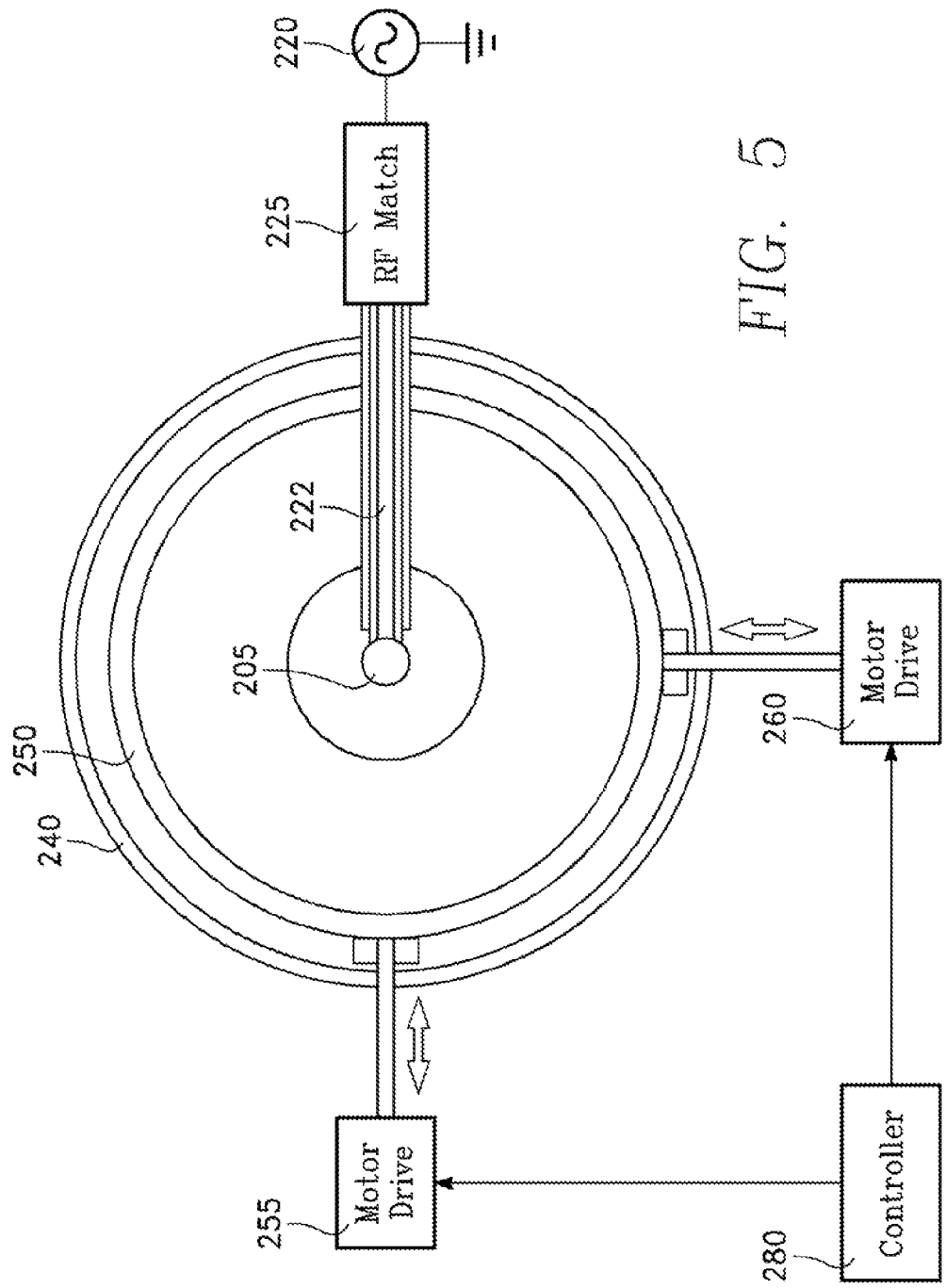
Figure 6:
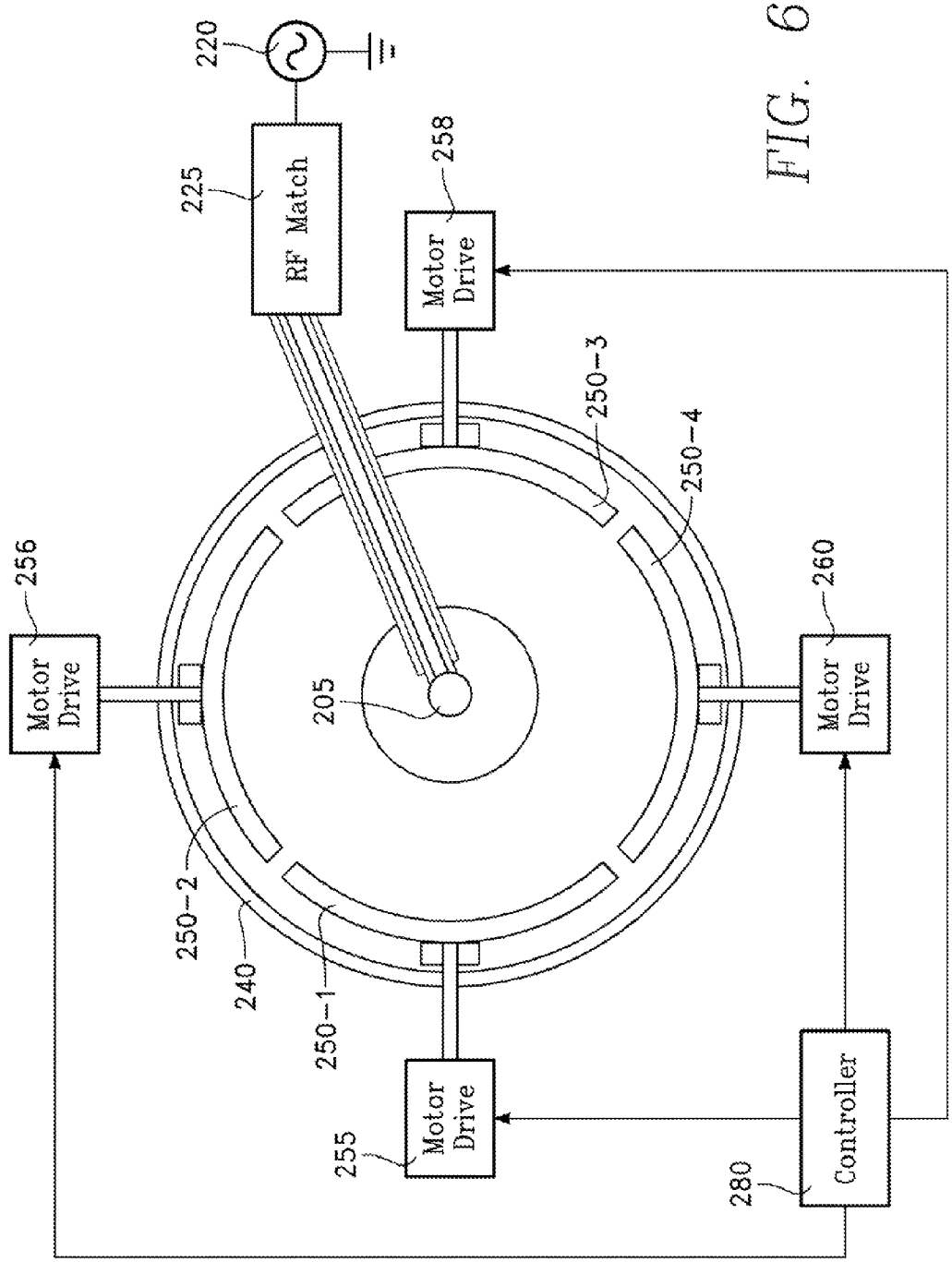
FIG. 6 depicts a fourth embodiment.

FIGS. 4 and 5 depict a modification of the embodiment of FIG. 2A in which the location of the ring 250 and motor drives 255, 260 is shifted downwardly (toward the showerhead), while increasing the diameter of the ring 250 to accommodate the increased diameter of the expansion section 230. FIG. 6 depicts a modification of the embodiment of FIG. 3 in which the plural arc sections 250-1, 250-2, 250-3, etc., and the associated motor drives are shifted downwardly (toward the showerhead) similar to the modification depicted in FIG. 5. The effective diameter of the plural arc sections may be increased in the embodiment of FIG. 6 from that of FIG. 3 to accommodate the increased diameter of the expansion section 230.

Figure 7:
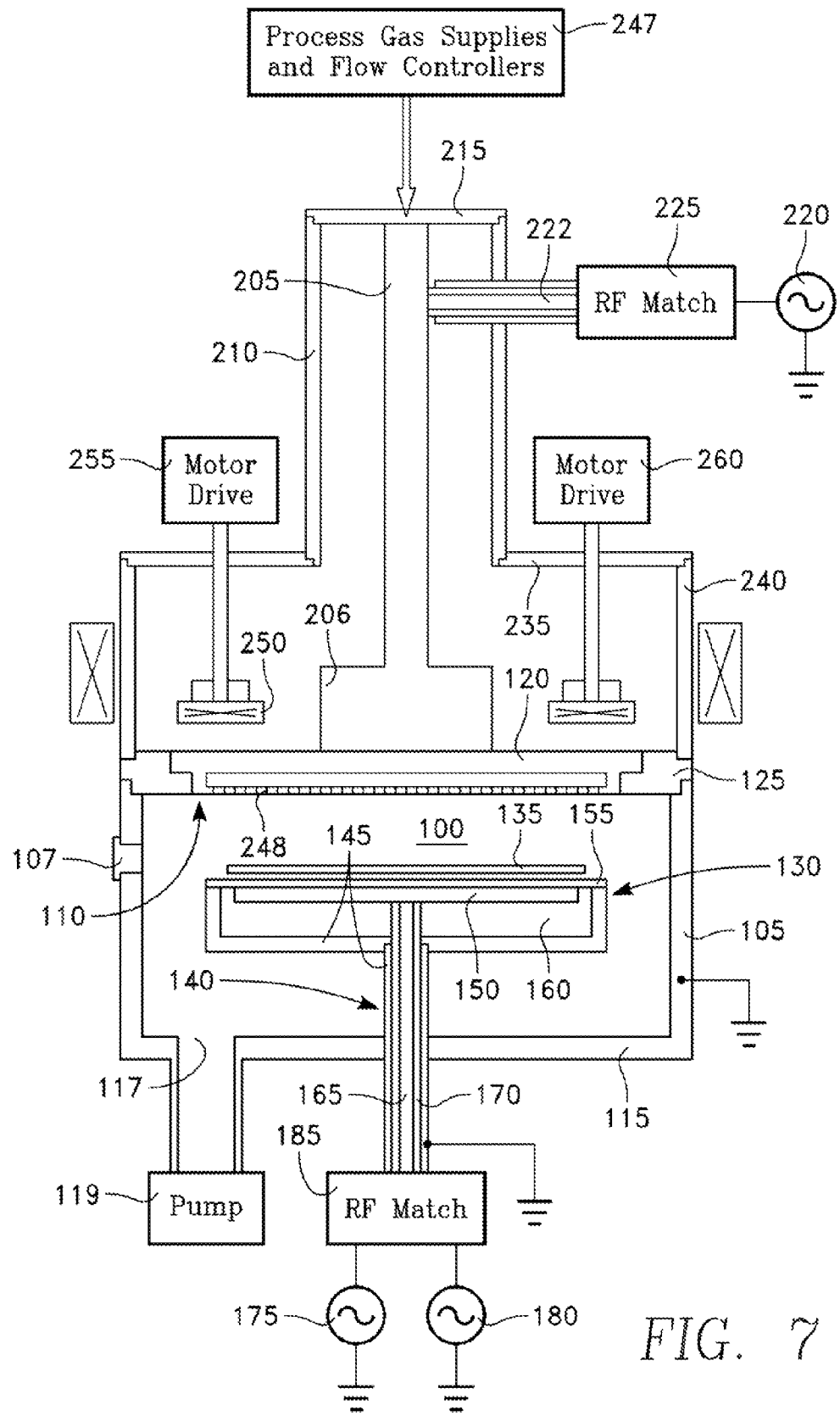
FIGS. 7 and 8 depict a fifth embodiment.
Figure 8:
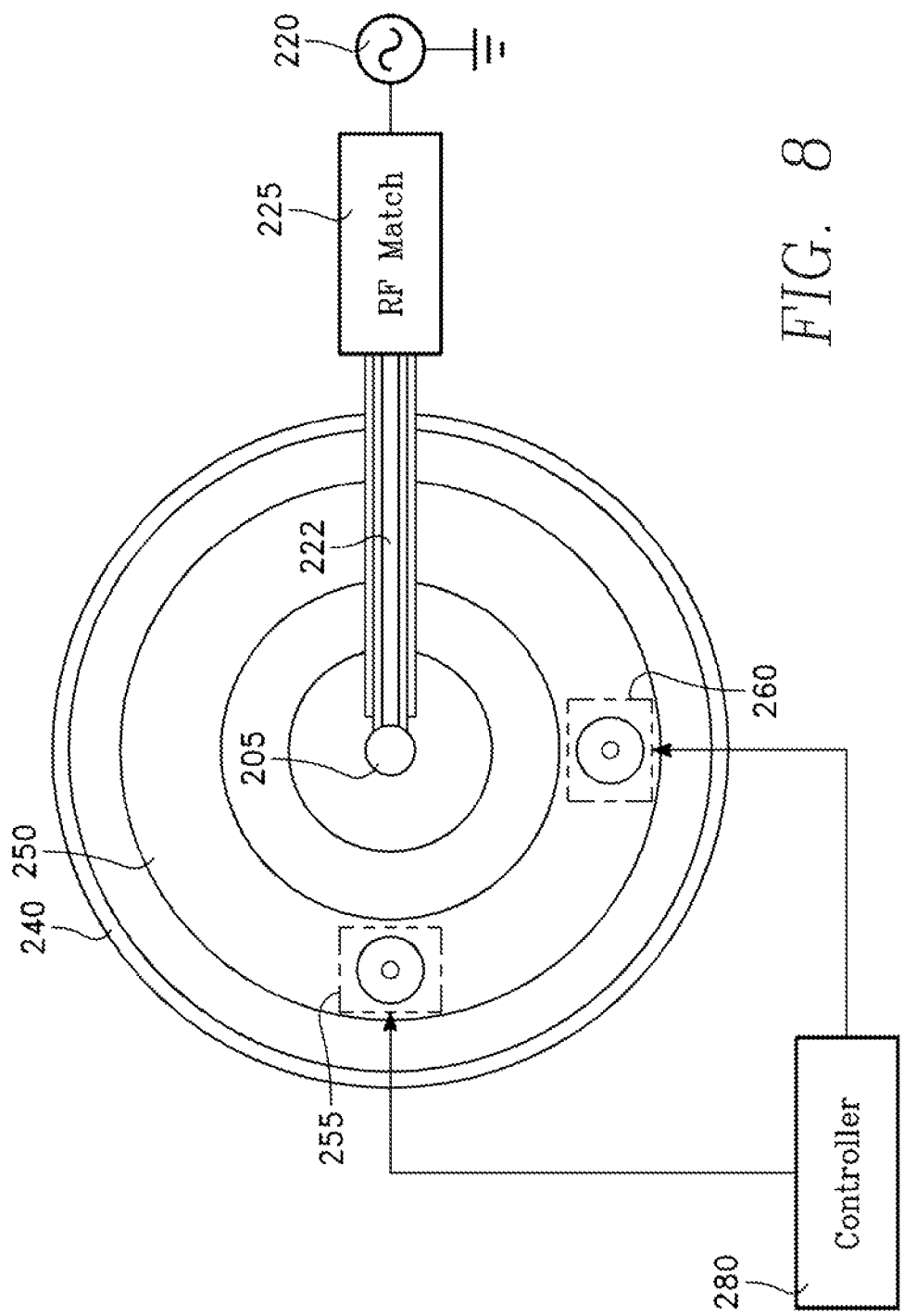

FIGS. 7 and 8 depict a modification of the embodiment of FIG. 4 in which the ring 250 overlies the showerhead 120 and the motor drives 255, 260 are oriented to move the ring 250 in the axial (vertical) direction. Each motor drive 255, 260 extends through and contacts the expansion section 235 of the outer conductor, thereby coupling the ring 250 to ground. The proximity of different portions of the ring 250 to the showerhead 120 controls azimuthal distribution of RF power in the showerhead 120. In the embodiment of FIGS. 7 and 8, the ring 250 may have a narrow dimension in the axial direction and a greater dimension in the radial direction, so as to present a broad surface to the showerhead 120.

Figure 9:
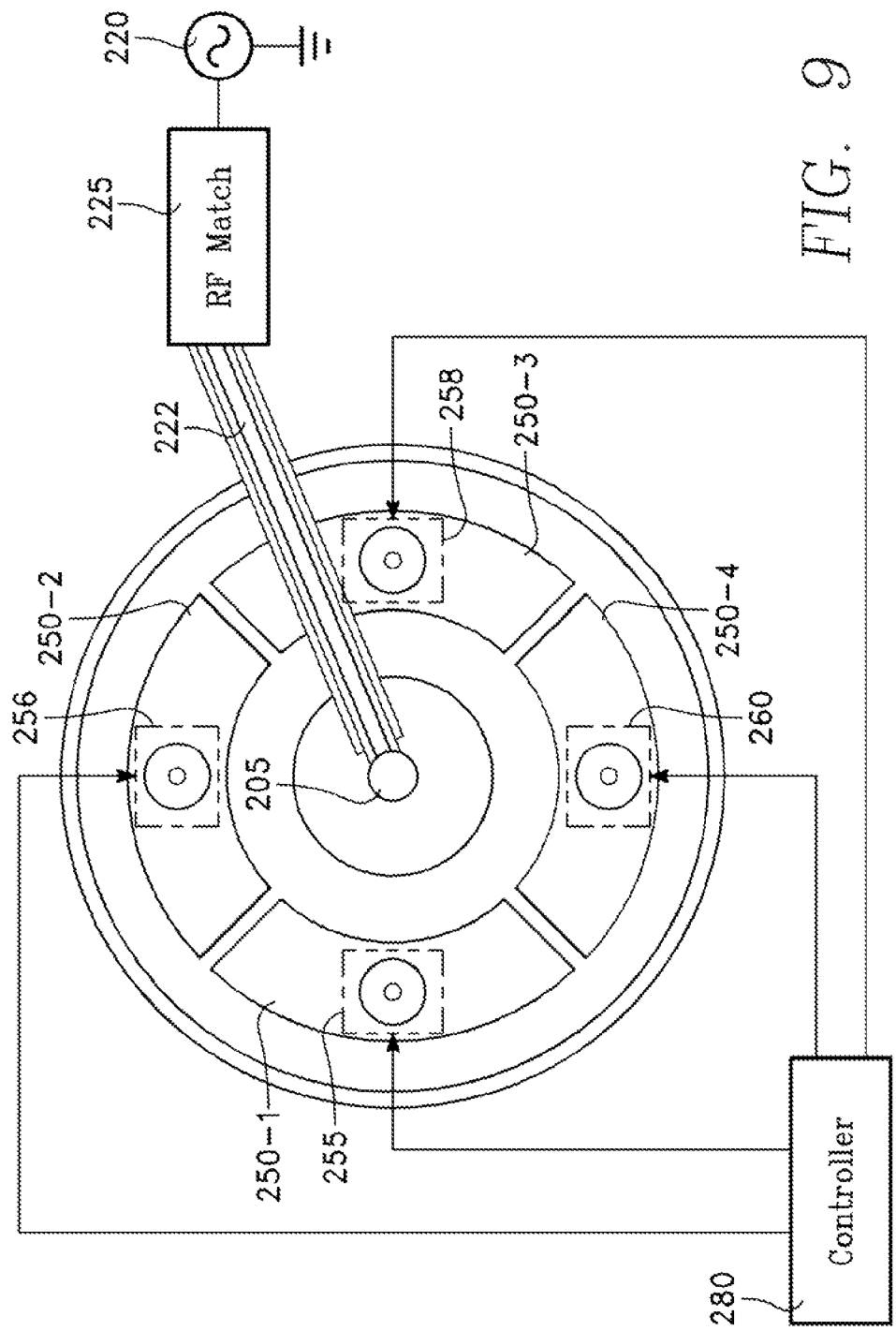
FIG. 9 depicts a sixth embodiment.
Figure 10:
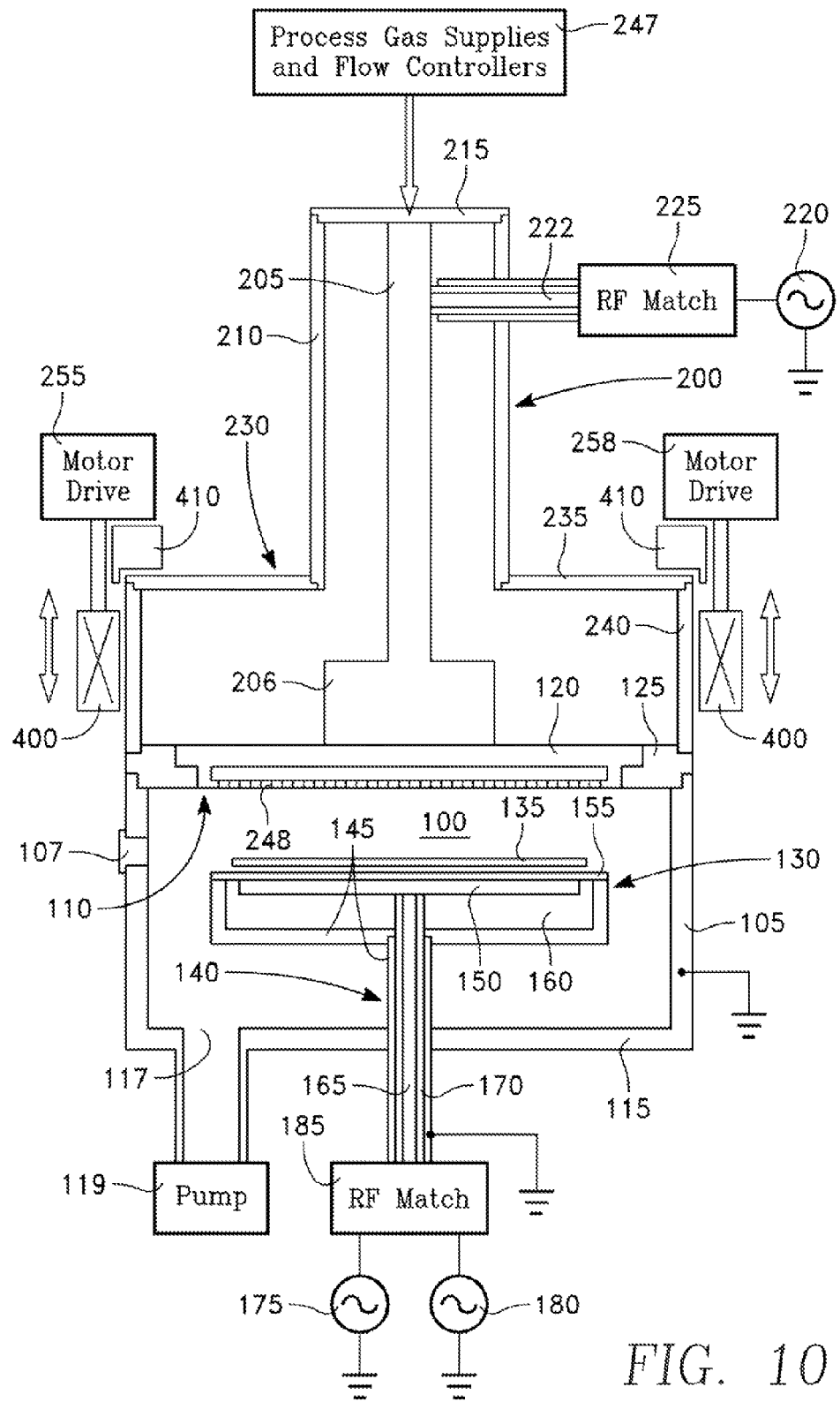
FIG. 10 depicts a seventh embodiment.

FIG. 9 depicts a modification of the embodiment of FIG. 6 in which the arc sections 250-1 through 250-4 overlie the showerhead 120 and the motor drives 255, 256, 258, 260 are oriented to move the arc sections 250-1, 250-2, 250-3, 250-4 in the axial (vertical) direction. Each motor drive 255, 256, 258 260 extends through and contacts the expansion section 235 of the outer conductor 210, thereby coupling each ring section to ground. The proximity of the different arc sections 250-1, 250-2, 250-3, and 250-4 to the showerhead 120 controls azimuthal distribution of RF power in the showerhead 120. In the embodiment of FIG. 9, each arc section 250-1, 250-2, 250-3, 250-4 may have a narrow dimension in the axial direction and a greater dimension in the radial direction, so as to present a broad surface to the showerhead 120. FIG. 10 depicts an embodiment having a movable outer magnet 400 surrounding the expansion section 230 below the outer conductor 210. The outer magnet 400 is ring-shaped and any number of the motor drives 255, 256, 258, 260 may be employed to govern a tilt angle of the outer magnet 400 about any radial axis of rotation. Each motor drive 255, 256, 258, 260 may be supported on a support ring 410 mounted on the expansion section 230.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
a vacuum chamber enclosure and an overhead ceiling electrode;
a coaxial power coupler comprising:
(a) a hollow cylindrical outer conductor having a bottom end coupled to said enclosure and a top end,
(b) a cylindrical inner conductor coaxial with said outer conductor and having a bottom end coupled to said ceiling electrode and a top end;
a movable conductive element inside said hollow cylindrical outer conductor and surrounding an axial section of said hollow cylindrical inner conductor;
respective plural motor drives contacting said hollow cylindrical outer conductor and connected to respective locations of said movable conductive element to control its non-concentricity relative to said cylindrical inner conductor, said movable conductive element being electrically coupled to said outer conductor through said motor drives;
an elongate tap conductor electrically separate from and extending radially through said outer conductor and having a first end connected to said inner conductor and a second end outside of said outer conductor;
an RF power generator; and
an RF impedance match circuit outside of said outer conductor and comprising an output connected to said second end of said elongate tap conductor and an input connected to said RF power generator.

2. The reactor of claim 1 wherein said movable conductive element comprises a conductive ring formed as a single piece, and said plural motor drives comprise first and second motor drives for moving said conductive ring in respective orthogonal radial directions.

3. The reactor of claim 1 wherein said movable conductive element comprises an integral ring and said respective plural motor drives alter concentricity of said ring relative to said inner conductor.

4. The reactor of claim 1 wherein said movable conductive element comprises a ring-shaped structure divided into plural arc segments, and respective ones of said plural motor drives are independently connected to respective ones of said plural arc segments.

5. The reactor of claim 4 wherein said motor drives are adapted to move said plural arc segments in respective radial directions independently.

6. The reactor of claim 1 wherein said cylindrical outer conductor comprises:
an upper section having a diameter less than a diameter of said chamber enclosure; and
a hollow conductive coaxial expansion section connected at one end to a bottom end of said upper section and connected at an opposite end to a top edge of said chamber enclosure.

7. The reactor of claim 6 wherein said movable conductive element is at an axial location between said coaxial expansion section and said elongate tap conductor.

8. The reactor of claim 6 wherein said movable conductive element is located within said coaxial expansion section.

9. The reactor of claim 1 wherein said movable conductive element comprises a conductive ring formed as a single piece in facing relationship with said ceiling electrode, and said plural motor drives comprise first and second motor drives for moving respective portions of said ring so as to change a displacement between each of said portions and said ceiling electrode.

10. The reactor of claim 1 wherein said movable conductive element comprises a ring-shaped structure divided into plural arc segments, each said segment being in facing relationship with said ceiling electrode, and respective ones of said plural motor drives are independently connected to respective ones of said plural arc segments to move said segments so as to change a displacement between each of said segments and said ceiling electrode.

11. The reactor of claim 1 wherein said cylindrical outer conductor comprises:
an upper section having a diameter less than a diameter of said chamber enclosure; and
a hollow conductive coaxial expansion section connected at one end to a bottom end of said upper section and connected at an opposite end to a top edge of said chamber enclosure, wherein said movable conductive element is located within said coaxial expansion section;
wherein said movable conductive element comprises a conductive ring formed as a single piece in facing relationship with said ceiling electrode, and said plural motor drives comprise first and second motor drives for moving respective portions of ring so as to change a displacement between each of said portions and said ceiling electrode.

12. The reactor of claim 1 wherein said cylindrical outer conductor comprises:
an upper section having a diameter less than a diameter of said chamber enclosure; and a hollow conductive coaxial expansion section connected at one end to a bottom end of said upper section and connected at an opposite end to a top edge of said chamber enclosure, wherein said movable conductive element is located within said coaxial expansion section;

wherein said movable conductive element comprises a ring-shaped structure divided into plural arc segments, each said segment being in facing relationship with said ceiling electrode, and respective ones of said plural motor drives are independently connected to respective ones of said plural arc segments to move said segments so as to change a displacement between each of said segments and said ceiling electrode.

13. The reactor of claim 1 further comprising a controller governing said plural motor drives in accordance with a desired azimuthal distribution of RF power in said ceiling electrode.

14. The reactor of claim 1 wherein said impedance match circuit is displaced from said outer conductor in a radial direction along a portion of a length of said elongate tap conductor.

* * * * *